United States Patent [19]
Kamiguchi et al.

[11] Patent Number: 5,493,465
[45] Date of Patent: Feb. 20, 1996

[54] MAGNETORESISTANCE EFFECT ELEMENT AND MAGNETIC RECORDING APPARATUS

[75] Inventors: Yuzo Kamiguchi, Yokohama; Susumu Hashimoto, Ebina; Atsuhito Sawabe, Yokosuka; Hitoshi Iwasaki; Masashi Sahashi, both of Yokohama, all of Japan

[73] Assignee: Kabushiki Kaisha Toshiba, Kanagawa, Japan

[21] Appl. No.: 209,927

[22] Filed: Mar. 14, 1994

[30] Foreign Application Priority Data

Mar. 15, 1993 [JP] Japan ................................. 5-053606

[51] Int. Cl.$^6$ .......................... G11B 5/39; H01L 43/08; G01R 33/09
[52] U.S. Cl. .................... 360/113; 338/32 R; 324/207.21
[58] Field of Search ......................... 360/113; 338/32 R; 324/252, 207.21

[56] References Cited

U.S. PATENT DOCUMENTS

| | | | |
|---|---|---|---|
| 5,134,533 | 7/1992 | Friedrich | 360/113 |
| 5,304,975 | 4/1994 | Saito et al. | 360/113 |
| 5,341,261 | 8/1994 | Dieny et al. | 360/113 |

OTHER PUBLICATIONS

"Influence of Au and Ag at the Interface of Sputtered Giant Magnetoresistance Fe/Cr Multilayers", Gurney et al., IEEE Transactions on Magnetics 26(5): 2747–2749 (1990).
"The role of spin–dependent impurity scattering in Fe/Cr giant magnetoresistance multilayers", Baumgart et al., J. Appl. Phys. 69(8):4792–4794 (1991).
"Magneto–optical properties and magnetic anisotropies for Au/Cu/Au/Co and Cu/Au/Cu/Co multilayers", Sakurai et al., J. Appl. Phys. 74(11):6840–6846 (1993).
"Giant magnetoresistance in soft ferromagnetic multilayers", B. Dieny et al., Physical Review B 43(1):1297–1300 (1991).
"Exchange coupling in magnetic heterostructures", M. D. Stiles, Physical Review B 48(10):7238–7258 (1993).

*Primary Examiner*—John H. Wolff
*Assistant Examiner*—George J. Letscher
*Attorney, Agent, or Firm*—Finnegan, Henderson, Farabow, Garrett & Dunner

[57] ABSTRACT

A magnetoresistance effect element has a pair of ferromagnetic layers with a middle non-magnetic metallic layer interposed therebetween. The middle non-magnetic metallic layer has lamination structure of non-magnetic metallic thin films formed of at least two kinds of non-magnetic metallic materials. In the lamination structure of the non-magnetic metallic thin film, Fermi energies of the non-magnetic metallic thin films disposed on interface sides of the ferromagnetic layers has a value closer to a Fermi energy in a direction of spin whose electron spin dependent mean free path is long among Fermi energies of the ferromagnetic layers. A non-magnetic metallic thin film is disposed between such two non-magnetic metallic thin films. Difference in Fermi energy between non-magnetic metallic thin films made of two kinds of non-magnetic metallic materials is 0.5 eV or more. By the use of such a middle non-magnetic metallic layer, while the thickness thereof is as thin as possible, exchange coupling between ferromagnetic layers can be small. Thus, resistance change sensitivity can be enhanced.

20 Claims, 3 Drawing Sheets

MAGNETORESISTANCE EFFECT ELEMENT AND MAGNETIC RECORDING APPARATUS

BACKGROUND OF THE INVENTION

1. Field of the Invention

The present invention relates to a magnetoresistance effect element suitable for use as a magnetic head and the like, and a magnetic recording apparatus where the magnetoresistance effect element is employed as a magnetic head.

2. Description of the Related Art

Recently, spin valve type magnetoresistance effect elements where resistance change by a magnetic field is extremely large (e.g., Phys. Rev. B., 43 (1991) 1297) are proposed instead of magnetoresistance effect elements where anisotropic magnetoresistance effect of a single-layer magnetic film is used. The spin valve type magnetoresistance effect elements have a pair of ferromagnetic layers separated by a non-magnetic metallic thin film (e.g., a Cu thin film) with a thickness of about 2 to 5 nm and an anti-ferromagnetic layer laminated on one of the ferromagnetic layers. Illustrative ferromagnetic layers include a NiFe alloy film and a Co film where the thickness of a unit ferromagnetic layer is about 5 to 10 nm. Illustrative anti-ferromagnetic layers include a FeMn alloy film.

In such a structure, while magnetization of a ferromagnetic layer which contacts an anti-ferromagnetic layer is fixed, only magnetization direction of a ferromagnetic layer which does not contact an anti-ferromagnetic layer varies. As a result, a state where magnetization of upper and lower ferromagnetic layers are parallel, and a state where the magnetization are antiparallel can be realized. A large change in resistance between both the states can be obtained by spin-dependent scattering.

In order to increase the resistance change sensitivity (%(A/m)) of the above-described spin valve type magnetoresistance effect elements, it is important that the resistance change ratio is increased and this change occurs on a magnetic field side as low as possible.

As a means for increasing the resistance change ratio itself, it is known that a middle non-magnetic metallic layer is made to be as thin as possible to increase the number of electrons moving between both the ferromagnetic layers without scattering. However, in conventional spin valve type magnetoresistance effect elements, if the thickness of a middle non-magnetic metallic layer made of e.g., Cu is 2 nm or less, the exchange coupling between the upper and lower ferromagnetic layers becomes stronger and it is difficult to change the angle formed by magnetization of both the ferromagnetic layers in a low magnetic field. Thus, even if the resistance change ratio itself is increased, the resistance change sensitivity cannot be enhanced.

SUMMARY OF THE INVENTION

An object of the invention is to provide a magnetoresistance effect element with the improved resistance change sensitivity by making a middle non-magnetic metallic layer to be as thin as possible and reducing the exchange coupling force between ferromagnetic layers.

A magnetoresistance effect element of the present invention is characterized by comprising at least one pair of ferromagnetic layers; and a middle non-magnetic metallic layer having lamination structure of non-magnetic metallic thin films formed of at least two kinds of non-magnetic metallic materials, the middle non-magnetic metallic layer being disposed between one pair of the ferromagnetic layer, a Fermi energy of the non-magnetic metallic thin films disposed on interface sides of the ferromagnetic layers having a value closer to a Fermi energy in a direction of spin whose electron spin dependent mean free path is long among Fermi energies of the ferromagnetic layers, difference in Fermi energy between two kinds of the non-magnetic metallic thin films being 0.5 eV or more.

In the magnetoresistance effect element of the present invention, a film of lamination structure, where non-magnetic metallic thin films made of at least two kinds of non-magnetic metallic materials are laminated, is used as a middle non-magnetic metallic layer separating upper and lower ferromagnetic layers. As difference in Fermi energy between two kinds of the non-magnetic metallic thin films constituting the film of lamination structure is 0.5 eV or more, electron reflection can be caused in the middle non-magnetic metallic layer. Accordingly, difference in reflection probability between a up spin electron and a down spin electron when electrons go from the middle non-magnetic metallic layer to the ferromagnetic layer becomes smaller, exchange coupling force between the ferromagnetic layers can be smaller.

The non-magnetic metallic thin film disposed on the interface side of a ferromagnetic layer is made of a non-magnetic metallic material with a Fermi energy closer to a Fermi energy in the direction of a spin whose electron spin dependent mean free path is long among Fermi energies of the ferromagnetic layer. Thus, inelastic scattering in the interface between the middle non-magnetic metallic layer and the ferromagnetic layer can be suppressed.

According to the present invention, exchange coupling between the upper and lower ferromagnetic layers can be cut while the thickness of the middle non-magnetic metallic layer is thin and the magnitude of spin dependent scattering is maintained. Thus, the resistance change ratio can be increased and further the change can occur on the low magnetic field side. Namely, the resistance change sensitivity can stably be improved.

A magnetoresistance effect element of the present invention is suitable not only as a magnetoresistance effect element using a spin valve film where a pair of ferromagnetic layers are not antiferromagnetically coupled, but also as a magnetoresistance effect element using an multilayers where many ferromagnetic layers and non-magnetic metallic layers are laminated.

DESCRIPTION OF THE PREFERRED EMBODIMENTS

Referring to embodiments, the present invention will now be described in detail.

Figure 1:
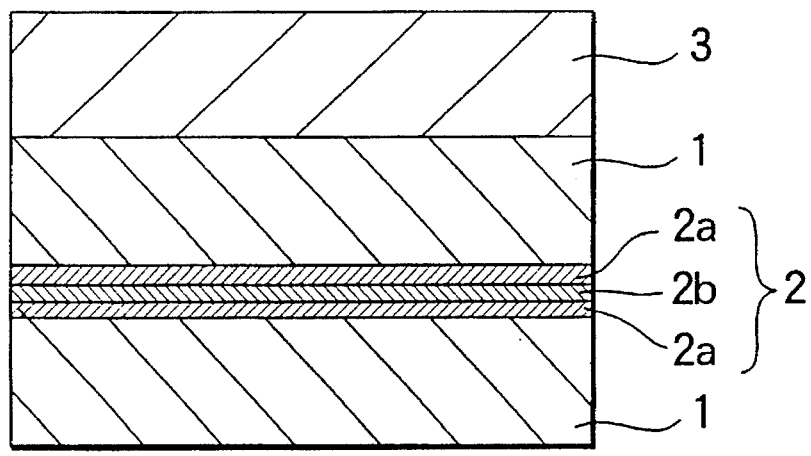
FIG. 1 is a sectional view schematically showing the structure of a magnetoresistance effect element according to one embodiment of the present invention.

FIG. 1 is a sectional view schematically showing the structure of one embodiment where the present invention is applied to a spin valve type magnetoresistance effect element. In FIG. 1, reference number 1, 1 represent ferromagnetic layers. A lamination structure film is disposed between these one pair of the ferromagnetic layers 1, 1 as a middle non-magnetic metallic film 2 separating these ferromagnetic layers. The lamination structure has non-magnetic metallic thin films 2a, 2b made of two kinds of non-magnetic metallic materials. Here, "non-magnetic" means "paramagnetic" or "diamagnetic". In the embodiment, the middle non-magnetic metallic layer 2 of lamination structure is of three-layer lamination structure. That is, the layer 2 has first non-magnetic metallic thin films 2a, 2a respectively disposed on the ferromagnetic layer 1, 1 sides and a second non-magnetic metallic thin film 2b disposed therebetween. In this drawing, reference number 3 represents a anti-ferromagnetic layer.

Illustrative materials of which the ferromagnetic layers 1, 1 are made include Co, Ni, Co based alloys represented by CoFe, and Ni based alloys represented by NiFe. Particularly, in view of soft magnetic properties and the magnitude of resistance change ratio, Ni, NiFeCo, CoFe and the like are preferable. Although the thickness of such ferromagnetic layers 1 is not limited, about 1 to 20 nm are preferable. Reasons for the range are because if the thickness is less than 1 nm, electron scattering on film surface is large and resistance change ratio tends to decrease; and if it exceeds 20 nm, ratio of shunt current increases to notably reduce resistance change ratio.

The first non-magnetic metallic thin film 2a and second non-magnetic metallic thin film 2b constituting the middle non-magnetic metallic layer 2 are respectively made of two kinds of non-magnetic metallic materials. The difference in Fermi energy between the two kinds of non-magnetic metallic materials is 0.5 eV or more. The first non-magnetic metallic thin films 2a disposed on the interface sides of the ferromagnetic layers 1 are made of a non-magnetic metallic material with a Fermi energy which is closer to a Fermi energy in a direction of spin whose electron spin dependent mean free path is long among Fermi energies of the ferromagnetic layer 1. Here, "Fermi energy" in the present invention means a value from the bottom of conduction band to a Fermi level in a Γ (gamma) point obtained by calculation based on the band theory such as a LMTO method, APW method and LAPW method.

Figure 2:
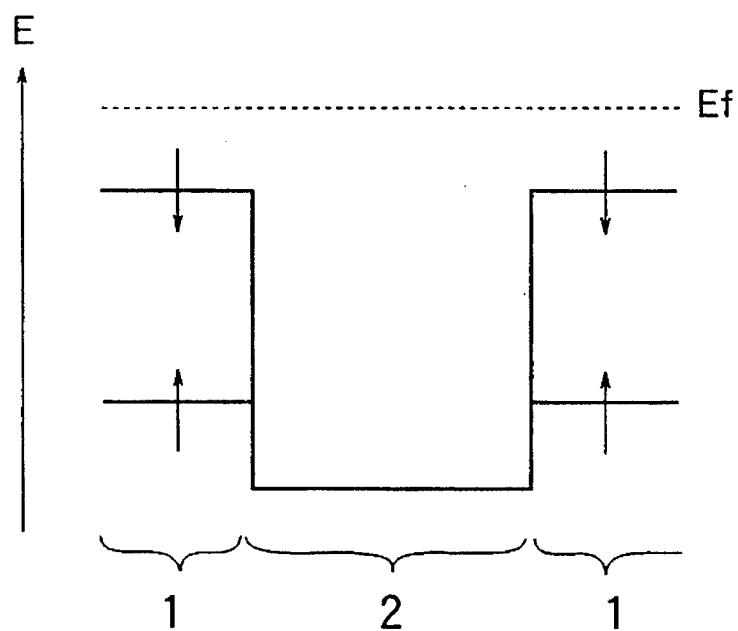
FIG. 2 is a view showing electron potential in a spin valve film.
Figure 3:
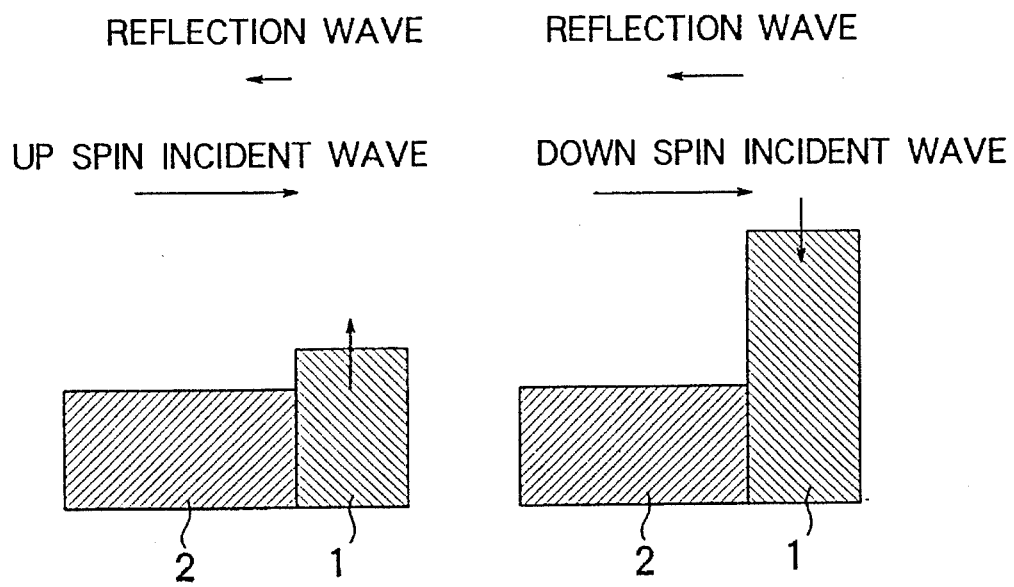
FIG. 3 is a view showing a reflection wave when an electron is injected from a middle non-magnetic metallic layer to ferromagnetic layers in a spin valve film.

A cause for occurrence of exchange coupling between ferromagnetic layers in spin valve films and the like is an effect of electron localization in a middle non-magnetic metallic layer (e.g., Phys. Rev. B, 48, P7238 (1993)). In a magnetic body, atomic potential which an electron with a down spin senses differs atomic potential which an electron with an up spin senses in height. Thus, as shown in FIG. 2, in spin valve films and the like, there is a difference in the forms between atomic potential which an up spin electron senses and atomic potential which a down spin electron senses, when magnetization of a pair of ferromagnetic layers are parallel or antiparallel. At this time, the state of electron localization changes to cause an energy difference. Then, parallel or antiparallel exchange coupling occurs so that a lower energy state is stabilized. Dependently on the magnitude of potential, the thickness of a middle non-magnetic metallic layer, Fermi surface form and the like, it is determined if a parallel state or antiparallel state is more stable. As shown in FIG. 3, the magnitude of exchange coupling is increased with increased difference in reflection probability of an up spin electron and down spin electron when electrons go from a middle non-magnetic metallic layer to a ferromagnetic layer.

Figure 4:
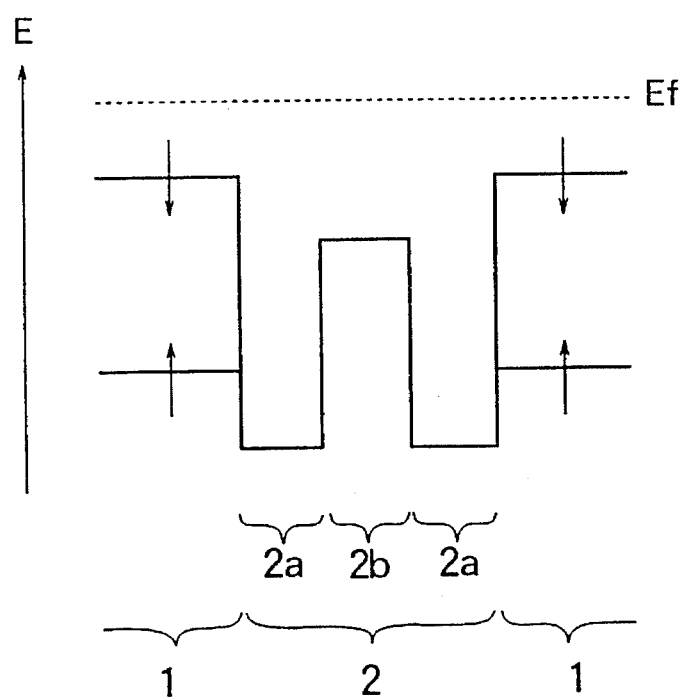
FIG. 4 is a view showing electron potential in a magnetoresistance effect element according to the present invention.
Figure 5:
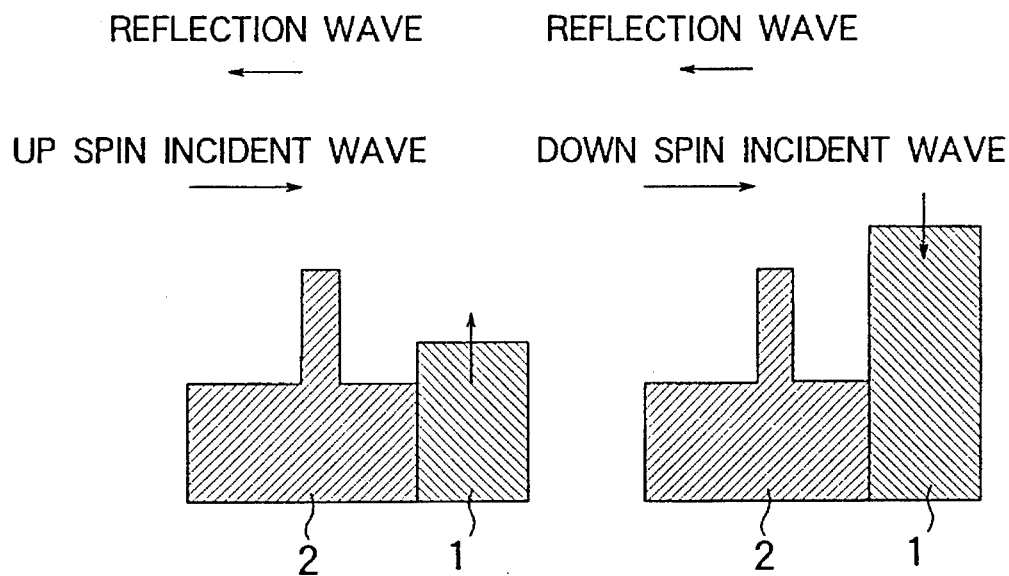
FIG. 5 is a view showing a reflection wave when an electron is injected from a middle non-magnetic metallic layer to ferromagnetic layers in a magnetoresistance effect element according to the present invention.

In the spin valve type magnetoresistance effect element of this embodiment, non-magnetic metallic thin film 2a, 2b with difference of 0.5 eV or more in Fermi energy formed of two kinds of non-magnetic metallic materials are used as a middle non-magnetic metallic layer 2 separating upper and lower ferromagnetic layers 1, 1. This reduces difference in reflection probability between an up spin electron and a down spin electron when electrons go from the middle non-magnetic metallic layer 2 to the ferromagnetic layer 1, therefore reducing exchange coupling between the ferromagnetic layers 1, 1. Namely, as shown in FIG. 4, modulation of atomic potential is given to the interior of the middle non-magnetic metallic layer 2 by using the middle non-magnetic metallic layer 2 where the two kinds of non-magnetic metallic thin films 2a, 2b with difference of 0.5 eV or more in Fermi energy are laminated. As a result, electron reflection in the middle non-magnetic metallic layer 2 can be caused. Accordingly, as shown in FIG. 5, difference in reflection probability of an up spin electron and a down spin electron when electrons go from the middle non-magnetic metallic layer 2 to the ferromagnetic layer 1. This reduces change in electron localization when magnetization of a pair of the ferromagnetic layers 1, 1 are parallel or antiparallel. Energy difference becomes smaller, and exchange coupling force becomes smaller.

At this time, in order not to decrease magnetoresistance change ratio, an electron in a direction of spin whose spin dependent mean free path is long in the ferromagnetic layer 1 is required not to receive inelastic scattering in the interface between the middle non-magnetic metallic layer 2 and the ferromagnetic layer 1. For this reason, the first non-magnetic metallic thin film 2a is formed of a non-magnetic metallic material with a Fermi energy closer to a Fermi energy in a direction of spin whose electron spin dependent mean free path is long among Fermi energies of the ferromagnetic layer 1, and the first non-magnetic metallic thin film 2a is disposed on the interface side of the ferromagnetic layer 1. Any non-magnetic metallic thin film 2a disposed on the ferromagnetic layer 1 side satisfying the above conditions can be used. However, in order to further increase the magnetoresistance change ratio, difference between a Fermi energy of a non-magnetic metallic material and a Fermi energy in a direction of spin whose electron spin dependent mean free path is long is desirably small. Concretely, preferable difference in Fermi energy is 0.5 eV or less.

Here, of the above-mentioned ferromagnetic bodies, in the case of Co, a Fermi energy of an up spin electron is 8.7 eV and that of a down spin electron is 7.2 eV. In the case of Ni, a Fermi energy of an up spin electron is 8.8 eV and that of a down spin electron is 8.4 eV. Co based alloys and Ni based alloys also exhibit similar values. In ferromagnetic bodies such as Co, Ni, Co based alloys and Ni based alloys, an up spin electron has a longer mean free path. Thus, for example, a non-magnetic metallic material with a Fermi energy closer to a Fermi energy of an up spin electron rather than a Fermi energy of a down spin electron is used for the first non-magnetic metallic thin film 2a. That is, when a non-magnetic body mainly formed of at least one element selected from Co and Ni is used as ferromagnetic layers 1, 1, a non-magnetic metallic material which satisfies the following equation as a constituent material of the first non-magnetic metallic thin film 2a disposed on the interface side against the ferromagnetic layer 1;

$$|E_f(up)-E_f(NM)|<|E_f(down)-E_f(NM)|$$

wherein $E_f(up)$ is a Fermi energy of an up spin electron of the ferromagnetic layer, $E_f(down)$ is a Fermi energy of a down spin electron of the ferromagnetic layer, and $E_f(NM)$ is a Fermi energy of the non-magnetic metallic material.

The above two conditions; i.e., (1) the difference in Fermi energy between two kinds of non-magnetic metallic thin films is 0.5 eV or more, and (2) a non-magnetic metallic thin film disposed on the interface side of a ferromagnetic layer is formed of a non-magnetic metallic material with a Fermi energy closer to a Fermi energy in a direction of spin whose electron spin dependent mean free path is long among Fermi energies of the ferromagnetic layer; are satisfied, which makes the thickness of a middle non-magnetic metallic layer 2 to be thin, increases the magnetoresistance change ratio, and can cut exchange coupling between upper and lower ferromagnetic layers 1, 1 without reducing this large magnetoresistance change ratio.

Concrete combination of non-magnetic metallic thin films 2a, 2b constituting a middle non-magnetic metallic layer 2 are shown below. First, considering Fermi energy values of the above-mentioned Co and Ni, suitable non-magnetic metallic materials constituting a first non-magnetic metallic thin film 2a disposed on the interface side of the ferromagnetic layer 1 include Cu ($E_f$=9.3 eV), Au ($E_f$=10.1 eV), Pt ($E_f$=9.4 eV) and alloys mainly formed thereof.

Suitable combinations of the above non-magnetic metallic materials of a first non-magnetic metallic thin film 2a and non-magnetic metallic materials of a second non-magnetic metallic thin film 2b whose Fermi energy differs from that thereof by 0.5 eV or more include; Cu ($E_f$=9.3 eV) - Ag ($E_f$=7.9 eV), Au ($E_f$=10.1 eV) - Ag ($E_f$=7.9 eV), Pt ($E_f$=9.4 eV) - Ag ($E_f$=7.9 eV), Cu ($E_f$=9.3 eV) - Pd ($E_f$=7.4 eV), Au ($E_f$=10.1 eV) - Pd ($E_f$=7.4 eV), Pt ($E_f$=9.4 eV) - Pd ($E_f$=7.4 eV), Cu ($E_f$=9.3 eV) - Au ($E_f$=10.1 eV), Pt ($E_f$=9.4 eV) - Au ($E_f$=10.1 eV). Alloys whose main component is at least one of the above elements may be used as a non-magnetic metallic material forming a second non-magnetic metallic thin film 2b.

Of the above combinations of two kinds of non-magnetic metallic materials, eutectic type or peritectic type combinations are particularly preferable in view of preventing reduction of effects due to mutual diffusion. Concrete preferable combinations include Cu-Ag, Au-Pt and Pt-Ag.

A middle non-magnetic metallic layer 2 has lamination structure of the above first non-magnetic metallic thin film 2a and second non-magnetic metallic thin film 2b. As shown in FIG. 1, the middle non-magnetic metallic layer 2 is basically of three-layer lamination structure where the first non-magnetic metallic thin films 2a are respectively disposed on the sides of ferromagnetic layers 1 and a second non-magnetic metallic thin film 2b is disposed therebetween. However, many variation can be made. For example, the second non-magnetic metallic thin film 2b may be further multi-layered. The two first non-magnetic metallic thin films 2a respectively disposed on the sides of the ferromagnetic layers 1 can be formed of the same material or different materials which satisfy the above conditions (1) and (2).

When using combinations of Cu-Au, Pt-Au and the like, either non-magnetic metallic material can be disposed on the sides of the ferromagnetic layers 1. However, a non-magnetic metallic material with smaller difference from a Fermi energy in a direction of spin whose electron spin dependent mean free path is long is preferably disposed on the sides of the ferromagnetic layers 1. For example, in the case of combination Cu-Au, Cu is disposed, and in the case of combination Pt-Au, Pt is disposed. In the case where both two kinds of non-magnetic metallic thin films 2a, 2b have a Fermi energy closer to a Fermi energy in a direction of spin whose electron spin dependent mean free path is long, a middle non-magnetic metallic layer 2 may be constructed by two-layer lamination of a first non-magnetic metallic thin film 2a and a second non-magnetic metallic thin film 2b.

The entire film thickness of a middle non-magnetic metallic layer 2 with the above lamination structure is preferably ranged from 1 nm to 5 nm. If the film thickness of the layer 2 exceeds 5 nm, the resistance change sensitivity cannot satisfactory be improved. If the film thickness is less than 1 nm, exchange coupling between ferromagnetic layers 1, 1 cannot sufficiently be small although the exchange coupling depends on the film thicknesses of non-magnetic metallic thin films 2a, 2b. Preferable thickness is ranged from 1.5 nm to 2.5 nm. The film thickness of each non-magnetic metallic thin film 2a, 2b is preferably ranged from 0.2 nm to 2 nm, more preferably from 0.5 nm to 1 nm. Reasons for this range are because it is difficult to form a film with thickness less than 0.2 nm and because if the thickness exceeds 2 nm, it is difficult that the entire thickness is 5 nm or less. Moreover, in the present invention, slight diffusion sometimes occurs between non-magnetic metallic thin film 2a, 2b. However, if lamination structure is locally formed, there is no problem.

Next, embodiments and evaluation results of magnetoresistance effect elements with the above structure will be described.

EXAMPLE 1

Figure 6:
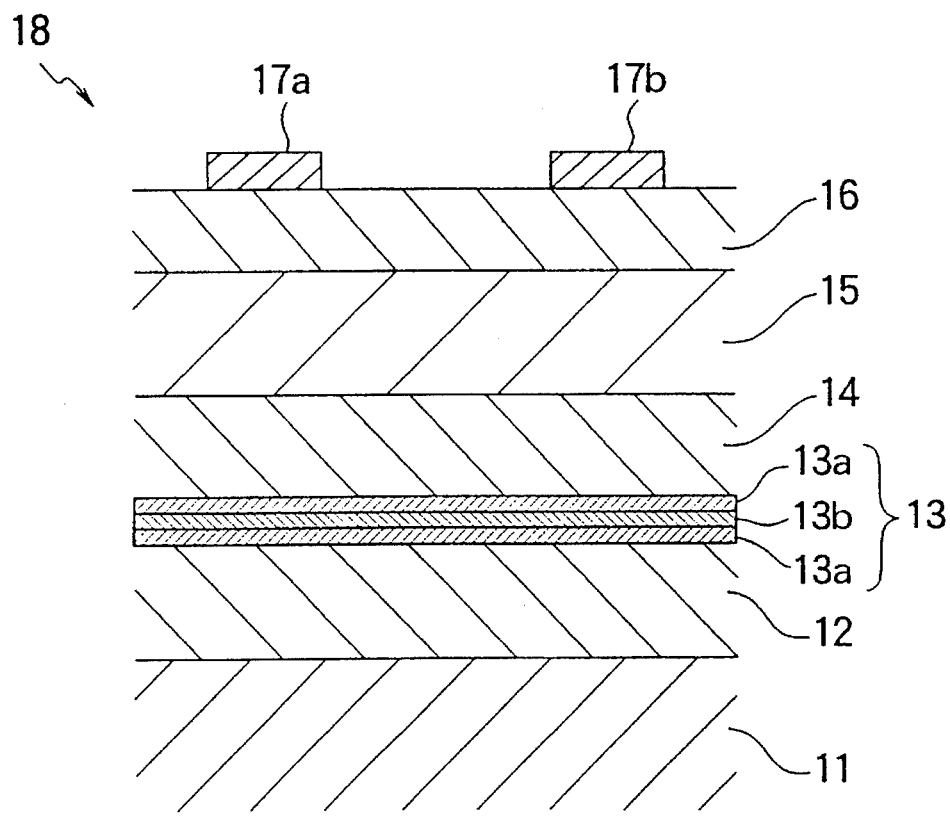
FIG. 6 is a view schematically showing the structure of a magnetoresistance effect element according to one embodiment of the present invention.

First, as shown in FIG. 6, a 7 nm thick CoFe alloy film was formed as a first ferromagnetic layer 12 on a sapphire substrate 11 by the RF sputtering method. Next, a 0.4 nm thick Cu thin film 13a, a 0.4 nm thick Pd thin film 13b and 0.4 nm thick Cu thin film 13c were subsequently formed on the first ferromagnetic layer 12. A middle non-magnetic metallic layer 13 consisted of this three-layer lamination film of Cu thin film 13a/Pd thin film 13b/Cu thin film 13c.

A 5 nm thick CoFe alloy film was laminated and formed as a second ferromagnetic layer 14 on the Cu thin film 13c of the middle non-magnetic metallic layer 13 of the three-layer lamination structure. A 14 nm thick FeMn alloy film was then laminated and formed as an anti-ferromagnetic layer 15. If necessary, a protective film 16 may be formed thereon. Further, electrodes 17a, 17b were formed to manufacture a spin valve type magnetoresistance effect element 18.

The magnetic properties and the resistance change ratio of the spin valve type magnetoresistance effect element thus obtained were evaluated. As far as the entire thickness of the middle non-magnetic metallic layer 13 is as thin as 1.2 nm, exchange coupling between the upper and lower ferromagnetic layers 12, 14 could be cut such that shift of a magnetization curve of the first ferromagnetic layer 12 was 400

A/m or less. A value of the resistance change ratio was as high as 10%.

COMPARATIVE EXAMPLES 1,2

Spin valve magnetoresistance effect elements were manufactured in a similar manner to Example 1 except that a middle non-magnetic metallic layer was a 1 nm thick Cu single layer (Comparative Example 1) or a 3 nm thick Cu single layer (Comparative Example 2). The properties thereof were evaluated in a similar manner to Example 1. In Comparative Example 1, as upper and lower ferromagnetic layers were strongly coupled, antiparallel state of magnetization could not be obtained. Thus, magnetoresistance effects could not be obtained. In Comparative Example 2, exchange coupling between upper and lower ferromagnetic layers could be cut. However, as the thickness of a middle non-magnetic metallic layer is thin, a value of resistance change ratio obtained was as small as 6%.

COMPARATIVE EXAMPLE 3

A spin valve magnetoresistance effect element was manufactured in a similar manner to Example 1 except that a middle non-magnetic metallic layer was a 3 nm thick Pd single layer. The properties thereof were evaluated in a similar manner to Example 1. Exchange coupling between upper and lower ferromagnetic layers could be cut and shift of a magnetization curve of a first ferromagnetic layer was about 240 A/m. However, a value of resistance change ratio obtained was as small as 5%.

COMPARATIVE EXAMPLE 4

A spin valve magnetoresistance effect element was manufactured in a similar manner to Example 1 except that lamination structure of a middle non-magnetic metallic layer consisted of a Pd thin film (0.4 nm)/Cu thin film (0.4 nm)/Pd thin film (0.4 nm). The properties thereof were evaluated in a similar manner to Example 1. Exchange coupling between upper and lower ferromagnetic layers could be cut and shift of a magnetization curve of a first ferromagnetic layer was about 400 A/m. However, as a value of Fermi energies of Pd is closer to Fermi energies of a down spin electron of CoFe alloy than that of an up spin electron of CoFe alloy, a value of resistance change ratio obtained was as small as 6%.

EXAMPLE 2

Spin valve magnetoresistance effect elements were manufactured in a similar manner to Example 1 except that lamination structure of a middle non-magnetic metallic layer was changed to combinations shown in Table 1. The properties thereof are also shown in Table 1.

TABLE 1

| Sample No. | Middle non-magnetic metallic layer | Shift of magnetization curve (A/m) | Resistance change ratio (%) |
|---|---|---|---|
| 1 | Cu(0.4 nm)/Ag(0.4 nm)/Cu(0.4 nm) | 320 | 13 |
| 2 | Au(0.4 nm)/Ag(0.4 nm)/Au(0.4 nm) | 240 | 11 |
| 3 | Au(0.4 nm)/Pd(0.4 nm)/Au(0.4 nm) | 240 | 9 |
| 4 | Au(0.4 nm)/Pt(0.4 nm)/Au(0.4 nm) | 400 | 10 |
| 5 | Pt(0.4 nm)/Ag(0.4 nm)/Pt(0.4 nm) | 240 | 9 |

Next, after each of these magnetoresistance effect elements was thermal-treated for one hour at 250° C., the magnetic properties were similarly evaluated. In combinations of eutectic type Cu-Ag (No. 1), Au-Pt (No. 4) and Pt-Ag (No. 5), magnetic connection between upper and lower ferromagnetic layers remained cut. In the other combinations (Nos. 2, 3), mutual diffusion occurred and magnetic connection became larger to increase shift of a magnetization curve.

Further, they were subjected to thermal treatment for one hour at 300° C. As a result, in combinations of eutectic type Cu-Ag (No. 1), Au-Pt (No. 4) and Pt-Ag (No. 5), mutual diffusion occurred and lamination structure was disordered. However, as lamination structure locally remained, magnetic connection was not increased so much.

In the present invention, ferromagnetic layers and a middle non-magnetic metallic layer of lamination structure constitute a resistance change part as a lamination film. The number of laminated layers is not limited. As described above, magnetoresistance effect elements of the present invention are suitable not only as a magnetoresistance effect element using a spin valve film where ferromagnetic bodies are not antiferromagnetically coupled, but also as a magnetoresistance effect element using an multilayers where many ferromagnetic layers and non-metallic layers are laminated.

Apparent from the above embodiments, according to magnetoresistance effect elements of the present invention, exchange coupling between upper and lower ferromagnetic layers can be cut while the thickness of a middle non-magnetic metallic layer is as thin as possible and the magnitude of spin dependent scattering is kept, thereby stably improving resistance change sensitivity.

What is claimed is:

1. A magnetic recording apparatus comprising:
 a magnetic head having a magnetoresistance effect element comprising:
  at least one pair of ferromagnetic layers;
  said ferromagnetic layers having a first Fermi energy in a first electron spin direction and a second Fermi energy in a second electron spin direction, said first electron spin direction having a longer electron spin dependent mean free path than said second electron spin direction;
  a non-magnetic metallic layer disposed between and abutting against said ferromagnetic layers and having a laminated structure comprising at least a first type of non-magnetic metallic thin film, and a second type of non-magnetic metallic thin film, said first type of non-magnetic metallic thin film being adjacent to and abutting against said second type of non-magnetic metallic thin film, the Fermi energies of the non-magnetic metallic thin films disposed adjacent to the ferromagnetic layers being closer to said first Fermi energy of the ferromagnetic layers than said second Fermi energy of the ferromagnetic layers, and the difference in the Fermi energies of the different non-magnetic metallic thin films being 0.5 eV or more; and
 a magnetic record medium.

2. The magnetic recording apparatus of claim 1, wherein the middle non-magnetic metallic layer has three-layer lamination structure in which two non-magnetic metallic thin films of a first type are disposed adjacent to and abut against the ferromagnetic layers and a non-magnetic metallic thin film of a second type is interposed between and abuts against the two first type non-magnetic metallic thin films.

3. The magnetic recording apparatus of claim 1, wherein the different non-magnetic metallic thin films include eutectic or peritectic combinations.

4. The magnetic recording apparatus of claim 1, wherein one pair of the ferromagnetic layers comprise a ferromagnetic body whose main component is at least one element selected from CO and Ni.

5. The magnetic recording apparatus of claim 4, wherein the non-magnetic metallic thin films disposed adjacent to the ferromagnetic layers comprise a non-magnetic metallic material whose main component is at least one element selected from Cu, Au and Pt.

6. The magnetic recording apparatus of claim 1, wherein the non-magnetic metallic thin films disposed adjacent to the ferromagnetic layers have a Fermi energy which differs by 0.5 eV or less from the first Fermi energy of the ferromagnetic layers.

7. The magnetic recording apparatus of claim 1, wherein the different non-magnetic metallic thin films are at least one combination selected from Cu-Ag, Au-Ag, Pt-Ag, Cu-Pd, Au-Pd, Pt-Pd, Cu-Au and Pt-Au.

8. The magnetic recording apparatus of claim 1, wherein the middle non-magnetic metallic layer a thickness of 1 nm to 5 nm.

9. The magnetic recording apparatus of claim 1, wherein the non-magnetic metallic thin films each have a thickness ranging from 0.2 nm to 2 nm.

10. The magnetic recording apparatus of claim 1, wherein each of the ferromagnetic layers have a thickness of 1 nm to 20 nm.

11. A magnetoresistance effect element comprising:

at least one pair of ferromagnetic layers;

said ferromagnetic layers having a first Fermi energy in a first electron spin direction and a second Fermi energy in a second electron spin direction, said first electron spin direction having a longer electron spin dependent mean free path than said second electron spin direction; and a non-magnetic metallic layer disposed between and abutting against said ferromagnetic layers and having a laminated structure comprising at least a first type of non-magnetic metallic thin film, and a second type of non-magnetic metallic thin film, said first type of non-magnetic metallic thin film being adjacent to and abutting against said second type of non-magnetic metallic thin film, the Fermi energies of the non-magnetic metallic thin films disposed adjacent to the ferromagnetic layers being closer to said first Fermi energy of the ferromagnetic layers than said second Fermi energy of the ferromagnetic layers, and the difference in the Fermi energies of the different non-magnetic metallic thin films being 0.5 eV or more.

12. The magnetoresistance effect element of claim 11, wherein the middle non-magnetic metallic layer has three-layer lamination structure in which two non-magnetic metallic thin films of a first type are disposed adjacent to and abut against the ferromagnetic layers and a non-magnetic metallic thin film of a second type is interposed between and abuts against the two first type non-magnetic metallic thin films.

13. The magnetoresistance effect element of claim 11, wherein the different non-magnetic metallic thin films include eutectic or peritectic combinations.

14. The magnetoresistance effect element of claim 11, wherein one pair of the ferromagnetic layers comprise a ferromagnetic body whose main component is at least one element selected from Co and Ni.

15. The magnetoresistance effect element of claim 14, wherein the non-magnetic metallic thin films disposed adjacent to the ferromagnetic layers comprise a non-magnetic metallic material whose main component is at least one element selected from Cu, Au and Pt.

16. The magnetoresistance effect element of claim 11, wherein the non-magnetic metallic thin films disposed adjacent to the ferromagnetic layers have a Fermi energy which differs by 0.5 eV or less from the first Fermi energy of the ferromagnetic layers.

17. The magnetoresistance effect element of claim 11, wherein the different non-magnetic metallic thin films are at least one combination selected from Cu-Ag, Au-Ag, Pt-Ag, Cu-Pd, Au-Pd, Pt-Pd, Cu-Au and Pt-Au.

18. The magnetoresistance effect element of claim 11, wherein the middle non-magnetic metallic layer a thickness of 1 nm to 5 nm.

19. The magnetoresistance effect element of claim 11, wherein the non-magnetic metallic thin films each have a thickness ranging from 0.2 nm to 2 nm.

20. The magnetoresistance effect element of claim 11, wherein each of the ferromagnetic layers have a thickness of 1 nm to 20 nm.

* * * * *

UNITED STATES PATENT AND TRADEMARK OFFICE
CERTIFICATE OF CORRECTION

PATENT NO. : 5,493,465
DATED : February 20, 1996
INVENTOR(S) : Yuzo KAMIGUCHI et al.

It is certified that error appears in the above-indentified patent and that said Letters Patent is hereby corrected as shown below:

Claim 18, column 10, line 36, after "layer", insert --has--.

Signed and Sealed this

Eighteenth Day of February, 1997

Attest:

BRUCE LEHMAN

Attesting Officer     Commissioner of Patents and Trademarks